(12) United States Patent
Huang

(10) Patent No.: US 6,700,180 B2
(45) Date of Patent: Mar. 2, 2004

(54) RECTIFYING DIODE

(75) Inventor: Eddie Huang, Stockport (GB)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 10/304,216

(22) Filed: Nov. 26, 2002

(65) Prior Publication Data

US 2003/0102534 A1 Jun. 5, 2003

(30) Foreign Application Priority Data

Dec. 5, 2001 (GB) .............................. 0129066

(51) Int. Cl.$^7$ .......................................... H01L 31/075
(52) U.S. Cl. ....................................................... 257/656
(58) Field of Search ........................................ 257/656

(56) References Cited

U.S. PATENT DOCUMENTS

| | | | |
|---|---|---|---|
| 4,754,310 A | 6/1988 | Coe | 257/287 |
| 4,982,260 A * | 1/1991 | Chang et al. | 257/656 |
| 6,388,306 B1 * | 5/2002 | Hirano et al. | 257/551 |

FOREIGN PATENT DOCUMENTS

| | | | |
|---|---|---|---|
| WO | WO9953553 | 10/1999 | H01L/29/861 |
| WO | WO0159844 | 8/2001 | H01L/29/06 |

* cited by examiner

*Primary Examiner*—David Nelms
*Assistant Examiner*—Tu-Tu Ho
(74) *Attorney, Agent, or Firm*—Aaron Waxler

(57) ABSTRACT

A semiconductor diode has a low bandgap layer (10) and an intermediate region (4) with a plurality of field relief regions (6, 8) extending between the low bandgap layer (10) and a first region (2) of opposite conductivity type. The field relief regions deplete the intermediate region in the off state of the diode.

12 Claims, 1 Drawing Sheet

RECTIFYING DIODE

Figure 1:
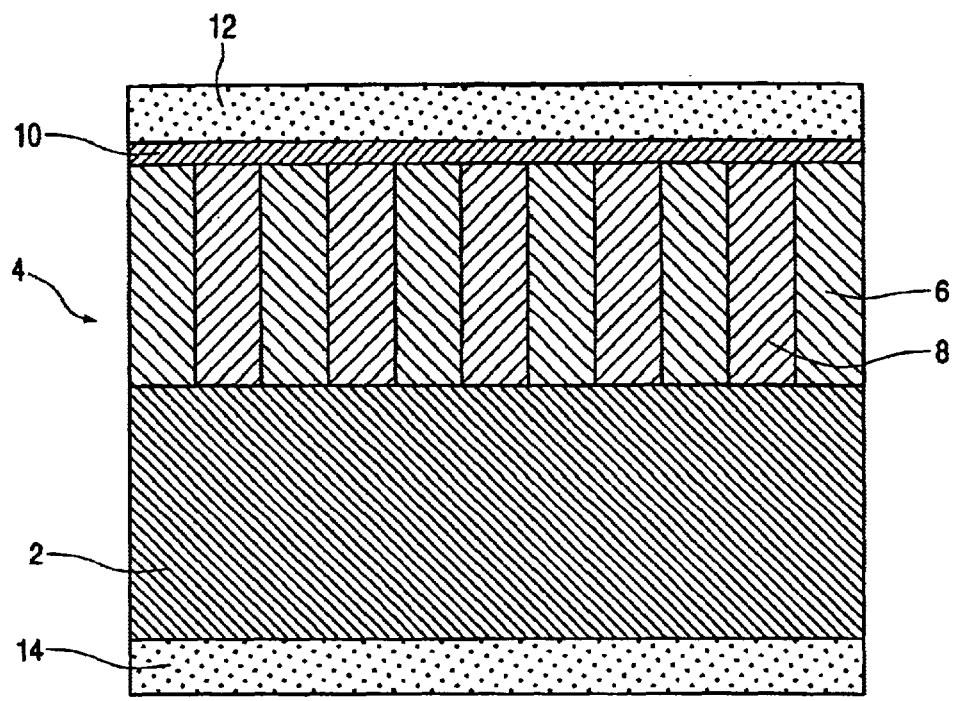

The invention relates to a rectifying diode, and in particular to a rectifying diode having an anode formed of a semiconductor of lower bandgap than the cathode.

A standard high voltage diode technology is a p-i-n diode structure with highly doped p+ and n+ regions sandwiching a low doped thin i region. The term "i region" is used in the present specification to refer to the low doped central region although in fact this region is not necessarily intrinsic and may be lightly doped n-type, or even perhaps p-type. The structure may be used, for example, for fast diodes with voltage ratings for example of 20V or more, e.g. around 600V.

In such p+-i-n+ structures, there are two components to the current through the diode when operated in a forward direction. Assuming the "i" region is n-type, one component is the hole current from holes in the p+ region entering the i region and recombining there, and the other component is the electron current from electrons in the i region entering the p+ region and recombining there. The hole current is generally dominant. Since the holes have a significant lifetime in the i region, there are an appreciable number of holes in the i region when the diode is conducting in the forward direction.

When the diode is switched from forward to reverse direction, these holes have to be removed, which takes time. In order to speed up the removal of the holes, the number of holes present during forward operation may be reduced. This may be achieved by doping the i region of the diode with recombination centres, also known as lifetime killers, such as gold or platinum. Alternatively, a region of different material may be introduced, for example by using an SiGe layer in a generally silicon structure. Misfit dislocations caused by the mechanical stress introduced between the layers of different material reduce the service lifetime of the minority carriers in a similar way to gold atoms.

When used for high voltage diodes rated at 600V this technology has a number of disadvantages, including a high forward voltage of 2.5V to 3.5V, and a much higher transient forward voltage during turn on, which may be as high as tens of volts. Reverse recovery includes heavy ringing (oscillations). Moreover, some dopants can deliver high reverse leakage at high temperature, leading to risks of thermal runaway.

A known approach to improving the reverse blocking characteristics of semiconductor structures is described in the fundamental patent U.S. Pat. No. 4,754,310 to Coe assigned to US Philips Corp. which describes the use of alternating p and n stripes as a region to be depleted to carry the high voltage across the device.

A further known approach is described in WO01/59844 to Philips. A p-i-n diode structure is formed with a plurality of trenches extending through the p and i layers into the n layer. Semi-insulating or resistive paths are formed in the trenches. When the device is reverse biased, an electric potential is generated along the reverse paths which causes a depletion region extending through the i layer. This increases the reverse breakdown voltage for a given doping level in the i-layer or equivalently increases the doping possible in the i-layer for a given breakdown voltage.

Each of the approaches of U.S. Pat. No. 4,734,310 and WO01/59844 is of particular benefit in unipolar devices such as MOSFETs and Schottky diodes, since it offers a way of increasing the doping in the middle i layer of a p-i-n structure and hence increasing conduction when the device is turned on whilst still ensuring that the i-layer can support a reverse voltage when the device is turned off.

For p-i-n diodes, the advantages of such field relief structures that enable the use of higher doping in the "i" region are less obvious. In such devices, it is always possible to use very low doped, close to intrinsic, "i" region to achieve maximum blocking voltage with minimum thickness. The low doped layer does not present a big disadvantage in the on-state since it is modulated by injection anyway, i.e. the number of carriers in the "i" layer during forward conduction is not simply the number of carriers from doping in the "i" layer but a much larger number of carriers, in particular holes injected from the p-anode.

As described in WO99/53553 to Philips, an ultrashort heterojunction rectifier structure may be used to reduce the reliance of a p-i-n diode on the injection of holes from the p-anode into the "i" region. This enables a very low reverse recovery time to be achieved without the use of recombination centres. A thin (short) region of low bandgap semiconductor, a silicon germanium alloy (SiGe) doped p-type, forms the anode of a diode in combination with a cathode formed of wider bandgap silicon (Si), doped n-type. The SiGe region is chosen to have a Si:Ge ratio that gives a lattice constant reasonably close to that of Si and is chosen to be sufficiently thin to largely avoid misfit dislocations.

Such diodes have a number of advantages compared to more conventional structures. In particular, in these diodes, a significant fraction of the current is carried by electrons injected from N-Si into the p-SiGe and recombining there. This reduces the level of injected holes in the n region when the diode is carrying current, as compared with conventional diode structures. This in turn means that the total voltage dropped in the diode during forward conduction is reduced and further that the reverse recovery time and charge transfer is low.

This technology has been successful in diodes intended for operation below 200V. The doping of $10^{15}$ cm$^{-3}$ in the thin low doped layer appears to be of the same order of magnitude as the injected hole concentration during operation in that layer. This results in a very fast switching time.

However, experiments on short SiGe diodes to produce a diode capable of supporting a reverse voltage of 600V did not result in a product with a low enough reverse recovery time for commercial applications.

WO99/53553 itself addresses this problem and suggests reducing the reverse recovery time by a lifetime control method such as platinum doping or irradiation. However, this can be difficult to combine with commercial processing for manufacturing short SiGe diodes.

Thus, there remains a need for a diode with a short reverse recovery time capable of supporting a large reverse voltage. Such diodes are needed, for example, for power factor correction applications.

According to the invention there is provided a semiconductor diode including: a first region formed of a first semiconductor material doped to have a first conductivity type; a second region formed of a second semiconductor material having a lower bandgap than the first semiconductor material; and an intermediate region extending between the first and second regions; wherein the thin second region has a thickness and the lattice mismatch of the first and second semiconductor materials are selected such that the level of mechanical stress remains below a level at which misfit dislocations are formed; and the intermediate region includes a plurality of laterally spaced field relief regions providing vertical parallel paths extending between the first and the second region for depleting the intermediate region in an off state of the diode.

The inventors have realised that the reason for the difficulty in producing SiGe diodes capable of withstanding 600V is that low doping, of order $10^{14}$ cm$^{-3}$, is required in the low doped n region adjoining the p-type SiGe layer. This doping is much lower than the $10^{15}$ cm$^{-3}$ doping that may be used in diodes operating at lower voltages. The n region also needs to be thicker to support the higher voltage. This thicker lower doped region stores more charge during forward operation than in low voltage devices, and the results show that the switching time is not a significant advance on conventional types. Thus, to extend the usability of ultrashort heterojunction rectifier structures to high voltage diodes such as those used in power factor correction applications, it is necessary to avoid too low a doping in the "i" region. The "i" region needs to be able to support a high voltage, such as 600V, in reverse blocking, but the doping level in the "i" region should be comparable to the level of holes injected from the SiGe P-anode.

The use of a field relief structure provides specific benefits in structures with a thin low bandgap layer. Such diode structures rely much less for forward conduction on the injection of holes from the p region that conventional structures, and more on injection of carriers from the intermediate region into the low bandgap layer than in convention-al structures. Thus, the density of injected holes in the low doped region during forward operation is much less.

The use of field relief regions allows a higher doping level in the intermediate region. This means that the total charge stored at any given injection level (injected charge less starting charge) is lower, thus resulting in a faster reverse recovery time and a lower reverse recovery current. In conventional diodes the density of injected charge may be large compared even with the higher doping level obtainable using field relief regions, resulting in minimal benefits from field relief regions. In contrast, the lower density of injected charge in a lower bandgap diode structure means that the increase in doping in the intermediate region that may achieved by the use of field relief regions gives a significant beneficial effect.

For the ultrashort heterojunction p-i-n rectifier structure, where the injection of holes from p-anode into the "i" region is intentionally suppressed in favour of more injection of electrons from the "i" region into the p-anode, the level of doping in the "i" region is important, not only for the switching transients but also for the forward conduction state, especially for higher voltages such as 600V. Thus the combination of the use of an ultrashort heterojunction with a field-relief technique which enables the use of higher doping in the "i" region may allow the manufacture of a high voltage diode with low forward voltage and very fast switching, without the disadvantages normally associated with the use of high levels of recombination centres.

The structure according to the invention gives a further beneficial effect. As explained above, in a p-i-n diode structure with a central low doped region the voltage dropped during operation depends more on the carrier density injected into the low-doped region from the p region than on the intrinsic doping level in the low doped region. Nevertheless, the inventors have realised that the forward recovery voltage, defined as the transient forward voltage during turn on, is dominated by the un-modulated series resistance of the intermediate region, since for a short time the intermediate region will not yet have had time to be fully modulated by injection of minority carriers. Since the structure according to the invention allows higher doping in the intermediate region for a given breakdown voltage than previously, the structure according to the invention can deliver a better (lower) forward recovery voltage than conventional approaches. Moreover, by using a diode structure according to the invention it may be possible to achieve the low reverse recovery time of less than 10 ns without the use of recombination centres such as gold or platinum doping in the intermediate region.

In particular, embodiments of the invention may deliver an ultrafast diode with a breakdown voltage in excess of 500V, and with good additional parameters, such as a low forward voltage less than 2V, a low reverse recovery time, for example less than 10 ns, and a low maximum reverse recovery current.

Moreover, by using a diode structure according to the invention it may be possible to avoid the use of lifetime killers such as gold or platinum doping in the intermediate region.

Conveniently, the first semiconductor material may be silicon and the second semiconductor material silicon-germanium (SiGe). The SiGe may have a germanium content of 10% to 30% by mass to avoid excessive lattice mismatch with the Si.

To avoid misfit dislocations, wherein the product of the thickness of the second material layer and the relative deviation of the lattice constants of the first and second semiconductor layers does not exceed 40 nm %, preferably 30 nm %. This latter level is a safe limit for avoiding misfit dislocations.

In embodiments, the intermediate region includes a plurality of laterally spaced field relief regions extending between the first and the second regions, the field relief regions being formed of the first semiconductor material and doped alternately p and n type. The doping in the alternate p and n type field relief regions should preferably be balanced such that the average doping of the intermediate region is much less than the doping in the first semiconductor region and much less than the doping in the second semiconductor region. In this way, the intermediate region should deplete when the device is turned off to support the reverse voltage.

The doping in the n-type field relief regions is in the range of $5\times10^{14}$ cm$^{-3}$ to $2\times10^{16}$ cm$^{-3}$, preferably in the range of $1\times10^{15}$ cm$^{-3}$ to $1\times10^{16}$ cm$^{-3}$. The doping in the p-type field relief regions should be chosen to balance the doping in the n-type regions—where the regions are of equal width the doping concentration may be chosen to be substantially the same in the n and p field relief regions.

The use of a higher doping density in the intermediate regions than would otherwise be possible has another benefit, in that it can further enhance the injection of electrons from the "i" region in to the p-SiGe anode. Thus, during forward conduction, the effect of a greater contribution from carriers injected from the intermediate region into the second region (caused mainly by the use of heterojunctions) will be further enhanced.

In alternative embodiments the field relief regions include a plurality of resistive paths extending through the intermediate region from the first semiconductor region to the second semiconductor region for generating a vertical electric potential gradient when the diode is reverse biased and causing depletion of the intermediate region.

The field relief regions may include a plurality of trenches extending through the intermediate region from the second region to the first region, the trenches containing resistive material contacting the first and second regions. The resistive material may be semi-insulating polysilicon.

The first region may be doped n+, the second region p+ and the intermediate region doped n-type with a doping concentration in the range $5\times10^{15}$ to $4\times10^{16}$ cm$^{-3}$.

The structures described above allow diodes to be produced with a breakdown voltage in excess of 500V in combination with other desirable parameters. The other desirable parameters may include a low forward voltage, for example below 2V, a low reverse recovery time, for example below about 10 ns, a low maximum reverse recovery current, and soft recovery with a minimum of ringing.

The skilled person will however appreciate that diodes according to the invention may be made with a variety of breakdown voltages as required. For example, a 1000V breakdown diode may be made with a doping level in the intermediate layer that would previously only have sufficed for a 300V diode.

Figure 2:
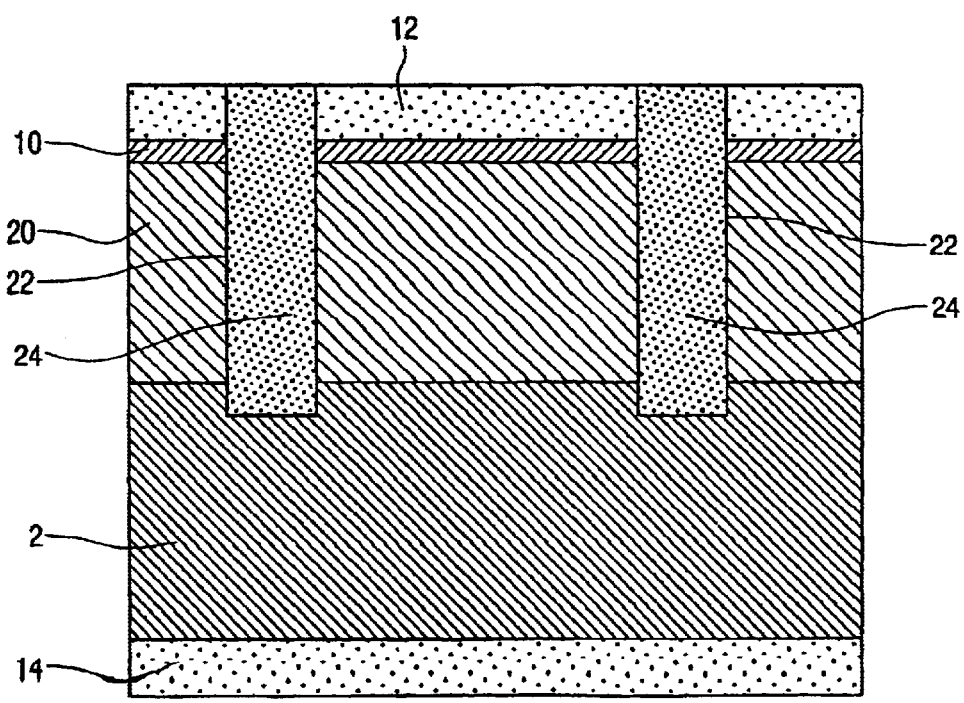

For a better understanding of the invention embodiments will now be described, purely by way of example, with reference to the accompanying drawings in which:

FIG. 1 shows a diode according to a first embodiment of the invention having alternating p-type and n-type field relief regions; and FIG. 2 shows a diode according to a second embodiment of the invention having trenches filled with resistive material.

Referring to FIG. 1, a diode structure according to a first embodiment of the invention is formed on a highly doped n+ Si substrate 2. An intermediate semiconductor region 4 is formed on the substrate 2. The intermediate region includes alternating p-type doped stripes 8 and n-type doped stripes 6 alternating laterally across the surface of the substrate 2. The stripes are doped to a doping concentration in the range $1 \times 10^{15}$ cm$^{-3}$ to $1 \times 10^{16}$ cm$^{-3}$, and each have a width of about 20 μm to 40 μm.

A thin p-doped SiGe region 10 is formed on the intermediate region. The germanium content is 20% by mass, and the thickness only 20 nm. Since a 100% germanium sample has a lattice constant that differs from that of silicon by 4%, the lattice constant deviation in this case is approximately 0.8%, resulting in a product of germanium content and lattice constant deviation of 16 nm %, below the safe limit of 30 nm %. The thin p-doped SiGe region 10 accordingly forms a strained layer.

The stripes 6,8 accordingly form a conducting path that connects vertically the SiGe region 10 and the highly doped substrate 2.

Contacts 12,14 are provided on the thin p-doped SiGe region 10 and the substrate 2.

In use, in forward operation the intermediate layer 4 conducts. Electrons are injected from the n-type stripes 6 into the thin SiGe region 10 and holes are injected from the SiGe region 10 into the intermediate layer. The structure with a thin SiGe region 10 has a much greater concentration of electrons carrying the current than in prior art devices with an ordinary homojunction p-n diode. Accordingly, the density of injected holes present in the intermediate region 4 during forward operation is now comparable to the starting doping of the n-region 6. When the device is switched from forward to reverse bias, the reduced number of injected holes present in the intermediate region are more rapidly cleared and this results in a much better switching time without requiring the use of lifetime killers.

The device has a reverse breakdown voltage of 600V and useful properties, including a low forward voltage, a low reverse recovery time, and a low lrrm (maximum reverse recovery current).

Referring to FIG. 2, an alternative embodiment of the invention uses alternative field relief regions. An N-Si intermediate region 20 is formed on an n+ Si substrate 2, and a thin p-SiGe layer 10 is formed on the N-Si intermediate region. The N-Si intermediate region 20 has a doping of around $1 \times 10^{15}$ cm$^{-3}$. A plurality of trenches 22 spaced laterally across the substrate extend through the thin p-SiGe layer 10 and the intermediate region 20 to the n+ substrate 2. The trenches include semi-insulating polysilicon (SIPOS) 24, either filling the trench as shown or alternatively surrounding a filler material, as described in the previously mentioned WO01/59844 to Philips which is incorporated herein by reference. The SIPOS 24 thus forms a resistive path between the substrate 2 and the thin SiGe layer 10.

When reverse biased, the semi-insulating polysilicon drops the voltage vertically between the thin p-SiGe layer 10 and substrate 2. This causes the intermediate region 20 to be depleted and to have a reasonably uniform vertical electric field, thus increasing the breakdown voltage that the intermediate region 20 can support for a given doping of the intermediate region.

This in turn means that the intermediate region can be more highly doped than in conventional p-i-n diodes. This doping level may then be comparable to the level of injected carriers from the p-anode from heterojunction rectifiers such as SiGe which have relatively low injection of holes anyway. Therefore, the switching time can be low even for diodes that can support 500V or more of reverse bias before breakdown.

The invention delivers a fast diode with a high voltage rating that may be useful, for example, for power factor correction applications. Nevertheless, the skilled person will appreciate that although the diodes are designed for a specific requirement, it is also possible to use the structures described for other purposes.

Although the examples use particular doping types for the various regions it will be appreciated by the skilled person that these may be varied according to need. For example, regions described as p-type may be doped n-type, and vice versa, or alternatively just some of the doping types may be changed. The specific sizes of the structures may be varied as required.

It is possible to form the structures described not directly on a substrate 2 but on an epilayer deposited on a substrate. This makes it possible to use an insulating or semi-insulating substrate if required.

The specific materials used may be altered as required, and the skilled person will be familiar with a number of materials of differing bandgaps, for example GaAs/AlGaAs, that may be used instead of SiGe/Si if required.

It should be noted that for conciseness singular terms are used in the present disclosure but are intended to include the plural. Thus, although the disclosure may refer to "an intermediate region", "a contact", "a diode" and the like the skilled person will realise that many devices and/or components may be included on a substrate and/or in a package and that the invention includes such multiple devices.

From reading the present disclosure, other variations and modifications will be apparent to persons skilled in the art. Such variations and modifications may involve equivalent and other features which are already known in the design, manufacture and use of semiconductor devices and which may be used in addition to or instead of features described herein. Although claims have been formulated in this application to particular combinations of features, it should be understood that the scope of disclosure also includes any novel feature or any novel combination of features disclosed herein either explicitly or implicitly or any generalisation thereof, whether or not it mitigates any or all of the same technical problems as does the present invention. The applicants hereby give notice that new claims may be formulated to any such features and/or combinations of such features during the prosecution of the present application or of any further applications derived therefrom.

What is claimed is:

1. A semiconductor diode including
    a first region formed of a first semiconductor material doped to have a first conductivity type;
    a thin second region formed of a second semiconductor material having a lower bandgap than the first semiconductor material; and
    an intermediate region extending between the first and second regions;
    wherein the thickness of the thin second region and the lattice mismatch of the first and second semiconductor materials are selected such that the level of mechanical stress remains below a level at which misfit dislocations are formed; and
    the intermediate region includes a plurality of laterally spaced field relief regions providing parallel paths extending between the first region and the second region for depleting the intermediate region in an off state of the diode.

2. A semiconductor diode according to claim 1 wherein the first semiconductor material is silicon and the second semiconductor material is silicon-germanium (SiGe).

3. A semiconductor diode according to claim 2 wherein the SiGe has a germanium content of 10% to 30% by mass.

4. A semiconductor diode according to claim 1 wherein the product of the thickness of the thin second region and the relative deviation of the lattice constant of the first and second semiconductor materials does not exceed 30 nm %.

5. A semiconductor diode according to claim 1 wherein the intermediate region includes a plurality of laterally spaced field relief regions extending between the first and the second regions, the field relief regions being formed of the first semiconductor material and doped alternately p and n type.

6. A semiconductor diode according to claim 5 wherein the doping in the alternate p and n type field relief regions is balanced such that the average doping of the intermediate region is much less than the doping in the first semiconductor region and much less than the doping in the second semiconductor region.

7. A semiconductor diode according to claim 6 wherein the doping in the n-type field relief regions is in the range of $5 \times 10^{14}$ cm$^{-3}$ to $2 \times 10^{16}$ cm$^{-3}$.

8. A semiconductor diode according to claim 1 wherein field relief regions include a plurality of resistive paths extending through the intermediate region from the first to the second region for generating a vertical electric potential gradient when the diode is reverse biased and causing depletion of the intermediate region.

9. A semiconductor diode according to claim 8 wherein the field relief regions include a plurality of trenches extending through the intermediate region from the second region to the first region, the trenches containing resistive material contacting the first and second regions.

10. A semiconductor diode according to claim 9 wherein the resistive material is semi-insulating polysilicon.

11. A semiconductor diode according to claim 8 wherein the first region is doped n+, the second region p+ and the intermediate region is doped n-type with a doping concentration of $5 \times 10^{15}$ to $4 \times 10^{15}$ cm$^{-3}$.

12. A semiconductor diode according to claim 1 having a reverse breakdown voltage of at least 500V.

* * * * *